United States Patent
Liu et al.

(10) Patent No.: US 10,629,527 B2
(45) Date of Patent: Apr. 21, 2020

(54) METHOD OF MANUFACTURING SEMICONDUCTOR DEVICE WITH MULTI WIRE STRUCTURE

(71) Applicant: TAIWAN SEMICONDUCTOR MANUFACTURING CO., LTD., Hsinchu (TW)

(72) Inventors: Kuo-Yen Liu, Hsinchu (TW); Boo Yeh, Hsinchu (TW); Min-Chang Liang, Hsin-Chu County (TW); Jui-Yao Lai, Changhwa (TW); Sai-Hooi Yeong, Hsinchu (TW); Ying-Yan Chen, Hsinchu (TW); Yen-Ming Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/196,366

(22) Filed: Nov. 20, 2018

(65) Prior Publication Data

US 2019/0109087 A1    Apr. 11, 2019

Related U.S. Application Data

(62) Division of application No. 15/061,627, filed on Mar. 4, 2016, now Pat. No. 10,269,697.

(Continued)

(51) Int. Cl.
*H01L 23/522* (2006.01)
*H01L 23/528* (2006.01)
(Continued)

(52) U.S. Cl.
CPC .... *H01L 23/5226* (2013.01); *H01L 21/76807* (2013.01); *H01L 21/76816* (2013.01);
(Continued)

(58) Field of Classification Search
CPC ............. H01L 23/5226; H01L 23/5283; H01L 21/76807; H01L 21/76816
See application file for complete search history.

(56) References Cited

U.S. PATENT DOCUMENTS

| 9,041,069 B2 | 5/2015 | Xiao et al. |
| 2009/0014796 A1* | 1/2009 | Liaw ............... H01L 27/11 257/347 |

(Continued)

FOREIGN PATENT DOCUMENTS

| CN | 102187453 A | 9/2011 |
| CN | 102623436 A | 8/2012 |

(Continued)

OTHER PUBLICATIONS

Taiwaniese Office Action issued in corresponding Taiwanese Application No. 105128879, dated Oct. 27, 2017.

(Continued)

*Primary Examiner* — Matthew E Warren
(74) *Attorney, Agent, or Firm* — McDermott Will & Emery LLP

(57) ABSTRACT

A semiconductor device includes a plurality of lower conductive lines overlying a substrate and extending in a first direction, an insulating layer overlying the plurality of lower conductive lines, a plurality of upper conductive lines overlying the insulating layer and the first conductive lines and extending in a second direction crossing the first direction, and a plurality of vias filled with a conductive material formed in the insulating layer. The plurality of upper conductive lines are arranged in the first direction with a first pitch. The plurality of vias includes first vias and second vias. At least one via of the first vias connects at least two lines of the plurality of lower conductive lines and one line of the plurality of upper conductive lines. An average width (Continued)

in the first direction of the first vias is different from an average width in the first direction of the second vias.

20 Claims, 6 Drawing Sheets

Related U.S. Application Data

(60) Provisional application No. 62/272,020, filed on Dec. 28, 2015.

(51) Int. Cl.
  *H01L 21/768* (2006.01)
  *H01L 23/532* (2006.01)
  *H01L 23/52* (2006.01)

(52) U.S. Cl.
  CPC ............ *H01L 23/52* (2013.01); *H01L 23/528* (2013.01); *H01L 23/5283* (2013.01); *H01L 23/5329* (2013.01); *H01L 23/53295* (2013.01); *H01L 21/76895* (2013.01); *H01L 23/53209* (2013.01); *H01L 23/53214* (2013.01); *H01L 23/53228* (2013.01); *H01L 23/53242* (2013.01); *H01L 23/53257* (2013.01)

(56) References Cited

U.S. PATENT DOCUMENTS

| | | |
|---|---|---|
| 2009/0152723 A1 | 6/2009 | Ou et al. |
| 2009/0321940 A1 | 12/2009 | Kunkel et al. |
| 2011/0001243 A1* | 1/2011 | Sel .................... H01L 21/76816 257/773 |
| 2014/0035142 A1 | 2/2014 | Yang et al. |
| 2016/0336264 A1 | 11/2016 | Rullan et al. |
| 2016/0351540 A1 | 12/2016 | Ogiso et al. |
| 2016/0358851 A1 | 12/2016 | Singh et al. |
| 2017/0186686 A1 | 6/2017 | Liu et al. |
| 2017/0194232 A1 | 7/2017 | Lin |
| 2017/0194248 A1 | 7/2017 | Das |

FOREIGN PATENT DOCUMENTS

| | | |
|---|---|---|
| CN | 102760693 A | 10/2012 |
| TW | 200427073 A | 12/2004 |
| TW | 201347193 A | 11/2013 |
| TW | 201419447 A | 5/2014 |
| TW | 201532146 A | 8/2015 |

OTHER PUBLICATIONS

Taiwaniese Office Action issued in corresponding Taiwanese Application No. 105128879, dated Apr. 19, 2018.

* cited by examiner

METHOD OF MANUFACTURING SEMICONDUCTOR DEVICE WITH MULTI WIRE STRUCTURE

CROSS-REFERENCE TO RELATED APPLICATIONS

This application is a divisional application of application Ser. No. 15/061,627 filed on Mar. 4, 2016, now U.S. Pat. No. 10,269,697, which claims the benefit of priority to U.S. Provisional Patent Application 62/272,020 filed Dec. 28, 2015, the entire disclosures of each of which are incorporated herein by reference.

TECHNICAL FIELD

The disclosure relates to semiconductor devices and particularly to via and metal wiring structures and methods for their fabrication.

BACKGROUND

As the semiconductor industry has progressed into nanometer technology process nodes in pursuit of higher device density, higher performance, and lower costs, challenges from both fabrication and design issues have resulted in the development of more dense arrangements of metal wirings and vias connecting upper and lower wirings. In particular, as the dimensions of the vias and metal wirings become smaller, a contact resistance becomes higher, and an electro migration issues become more severe. Accordingly, what are needed are an improved device and a method for fabricating a high density via and metal wiring structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1A:
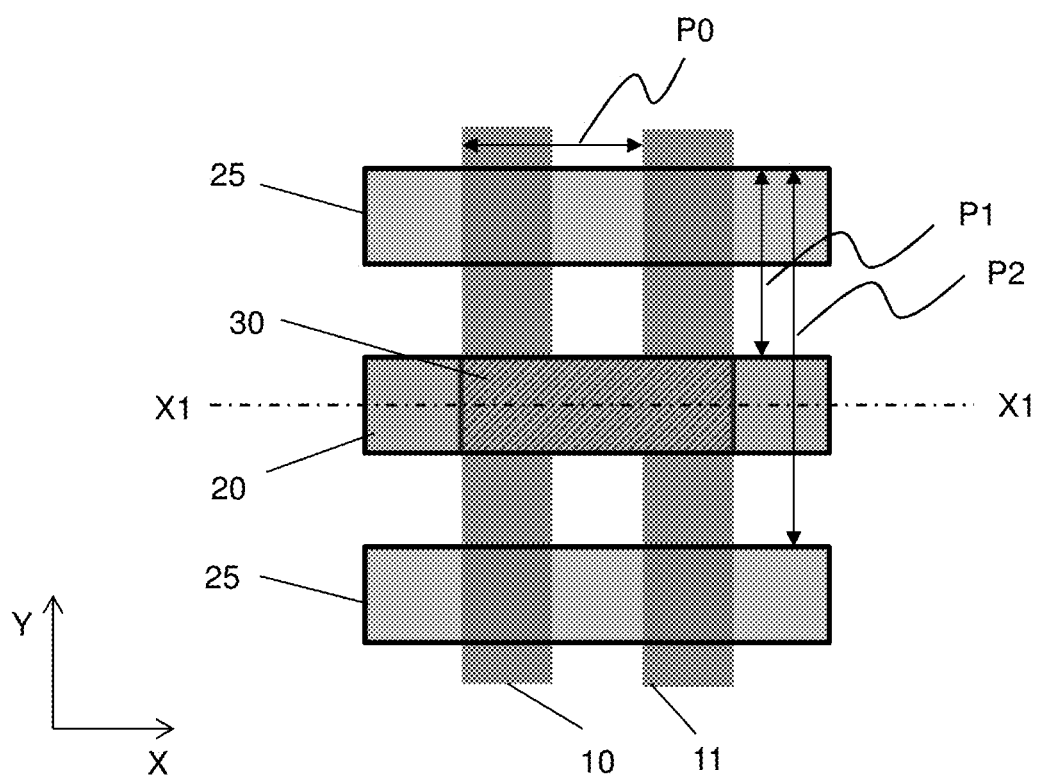
FIG. 1A is an exemplary layout structure according to one embodiment of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
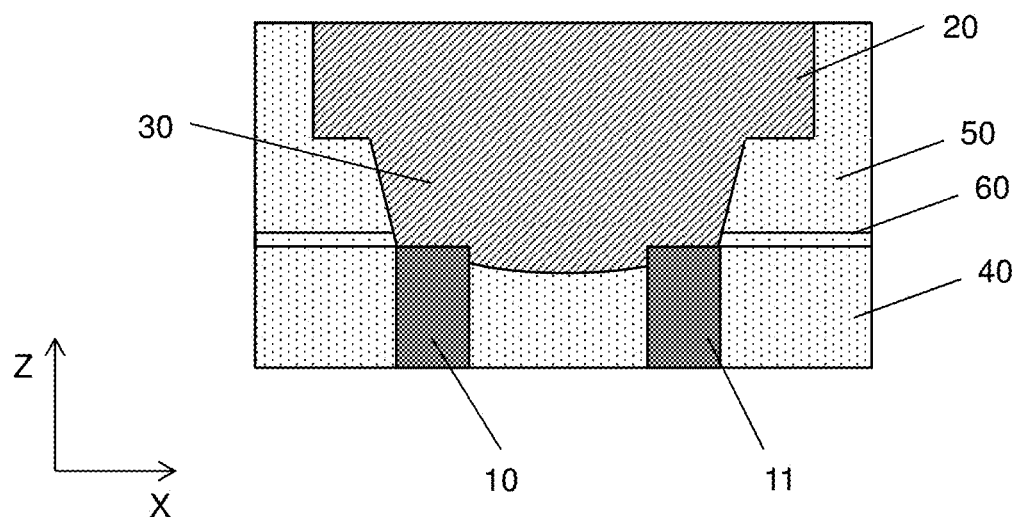
FIG. 1B is an exemplary cross sectional view of a semiconductor device corresponding to line X1-X1 of FIG. 1A.

FIG. 1A is an exemplary layout structure according to one embodiment of the present disclosure, and FIG. 1B is an exemplary cross sectional view of a semiconductor device corresponding to line X1-X1 of FIG. 1A.

In FIG. 1A, lower conductive lines 10, 11, which are disposed over a semiconductor substrate (not shown), extend in the Y direction and are arranged in parallel with each other in the X direction. In one embodiment, the lower conductive lines 10, 11 are arranged in the X direction with a pitch P0, and in other embodiments, the lower conductive lines 10, 11 are arranged with various pitches.

The lower conductive lines 10, 11 may be metal wirings or gate electrodes or source/drain electrodes of transistors, or any combination thereof, and made of, for example, one or more layers of conductive materials, such as aluminum, aluminum alloys, copper, copper alloys, nickel, nickel alloys, titanium, titanium alloys, tantalum, tantalum alloys, tungsten, tungsten alloys, tin, tin alloys, silver, silver alloys, gold, gold alloys, and combinations thereof. In some embodiments, the lower conductive lines 10, 11 are made of semiconductor material, such as polysilicon, crystalline silicon, SiGe or germanium.

Upper conductive lines including first upper conductive lines 20 and second upper conductive lines 25 are arranged over the lower conductive lines with one or more layers of insulating (dielectric) materials interposed therebetween. The upper conductive lines are made of, for example, one or more layers of conductive materials, such as aluminum, aluminum alloys, copper, copper alloys, nickel, nickel alloys, titanium, titanium alloys, tantalum, tantalum alloys, tungsten, tungsten alloys, tin, tin alloys, silver, silver alloys, gold, gold alloys, and combinations thereof.

In some embodiments, the first upper conductive lines 20 extend in the X direction and are arranged in parallel with each other with a pitch P2, and the second upper conductive lines 25 also extend in the X direction and are arranged in parallel with each other with the pitch P2. Respective first upper conductive lines and second upper conductive lines are alternately arranged in the Y direction, and the upper conductive lines, as a whole, are arranged with a pitch P1, where P2=2×P1.

In FIG. 1A, a via 30 is also disposed. The via 30 connects at least two lines 10, 11 of the lower conductive lines and one line (e.g., one first upper conductive line 20) of the upper conductive lines. The via 30 is filled with one or more layers of conductive materials, such as aluminum, aluminum alloys, copper, copper alloys, nickel, nickel alloys, titanium, titanium alloys, tantalum, tantalum alloys, tungsten, tungsten alloys, tin, tin alloys, silver, silver alloys, gold, gold alloys, and combinations thereof. The material for the via may be the same as or different from the materials for the lower conductive lines and/or the upper conductive lines.

The length of the via 30 in the X direction ranges from about 25 nm to about 75 nm, and a width of the via 30 in the Y direction ranges from about 10 nm to about 30 nm in plan view, in some embodiments.

The first upper conductive lines 20 and the second upper conductive lines 25 are fabricated not by the same step of patterning operations (e.g., lithography and etching) but by different steps of patterning operations. It is noted that the patterning conditions (e.g., recipes for the lithography and/or etching) may be the same for the first upper conductive lines 20 and the second upper conductive lines 25, or different from each other.

In the cross sectional view of FIG. 1B, the lower conductive lines 10, 11 are formed and embedded in the first insulating layer 40, and the via 30 is formed and embedded in the second insulating layer 50. Further, in some embodiments, a third insulating layer 60, which functions as an etching stop layer, is also disposed between the first insulating layer 40 and the second insulating layer 50.

The first insulating layer 40 and the second insulating layer 50 are respectively made of one or more layers of insulating material, such as silicon oxide-based material, silicon nitride-based material, fluorine-doped silicate glass (FSG), boron-fluorine-doped silicate glass (BPSG) and a low-K dielectric material. In one embodiment, one or more layers of silicon-oxide based material are used as the first insulating layer 40 and the second insulating layer 50.

The third insulating layer 60 is made of one or more layers of insulating material, such as silicon oxide-based material, silicon nitride-based material, fluorine-doped silicate glass (FSG), boron-fluorine-doped silicate glass (BPSG) and a low-K dielectric material. In one embodiment, one or more layers of silicon-oxide based material are used as the first insulating layer 40 and the second insulating layer 50. The third insulating layer 30 is selected so that an etching electivity during the etching of the second insulating layer 50 is sufficiently high. In one embodiment, one or more layers of silicon-nitride based material are used as the third insulating layer 60. The thickness of the third insulating layer 60 is in a range from about 1 nm to about 30 nm in some embodiments.

In some embodiments, the lower conductive lines are metal wirings disposed in the n-th (n is a natural number) metal wiring layer, and the upper conductive lines are metal wirings disposed in the (n+1)-th metal wiring layer. In other embodiments, the lower conductive lines include a line connected to a gate of a transistor and a line connected to a source or a drain of the transistor, and in such a case, the upper conductive line is connected to these lines through a via disposed in the first metal wiring layer and connected to a power supply line.

Figure 2A:
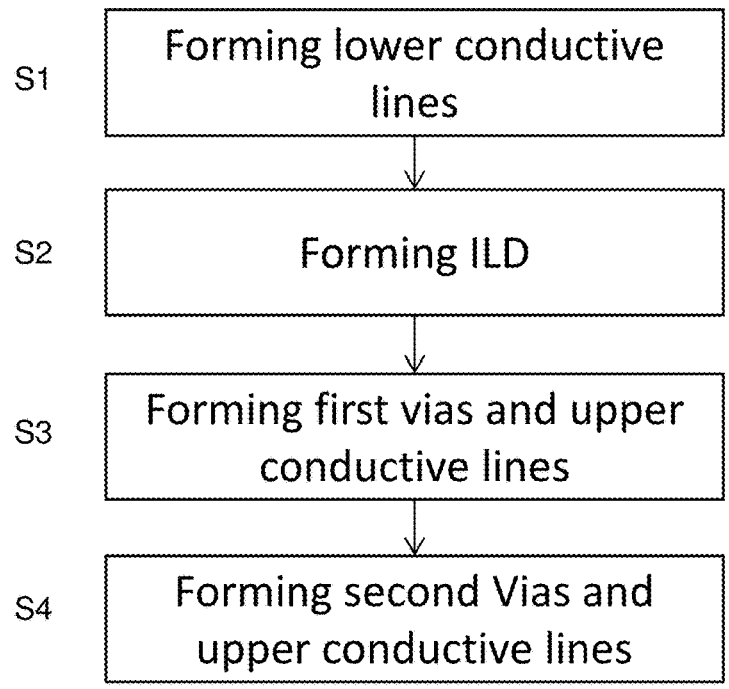
FIG. 2A is an exemplary flowchart illustrating a method of fabricating a semiconductor device according to one embodiment of the present disclosure.

FIG. 2A is an exemplary flowchart illustrating a method of fabricating a semiconductor device according to one embodiment of the present disclosure.

In S1 of FIG. 2A, the lower conductive lines 10, 11 are formed over a semiconductor substrate. The lower conductive lines 10, 11 may be formed by deposition of conductive layer and patterning the conductive layer. A damascene process may be employed to form the lower conductive lines. In S2, a first insulating layer (e.g., 40) as an interlayer dielectric (ILD) layer overlying the lower conductive lines is formed by using, for example, chemical vapor deposition (CVD).

In S3, the first vias and the first upper conductive lines are formed. The first vias and the first upper conductive lines may be formed by using a dual damascene process, in which a second insulating layer is formed over the first insulating layer, the second insulating layer is patterned to form openings for the vias and the upper conductive lines, the openings are filled with a conductive material, and a planarization process, such as chemical mechanical polishing (CMP) is performed. Here, in forming the first openings, at least part of two lines of the lower conductive lines may be exposed in at least one opening, so that at least one via connects the at least two lines of the lower conductive lines and one line of the first upper conductive lines.

After the first vias and the first upper conductive lines are formed, in S4, the second vias and the second upper conductive lines are formed by, for example, using a dual damascene process. Here, in forming the second openings, at least part of two lines of the lower conductive lines may be exposed in at least one opening, so that at least one via connects the at least two lines of the lower conductive lines and one line of the first upper conductive lines.

Alternatively, in other embodiments, after the first vias and the second vias are formed in the first insulating material by separate patterning operations, a second insulating layer is formed over the first and second vias and the first insulating layer, and then the first upper conductive lines and the second upper conductive lines are formed by separate patterning operations.

In either case, in at least one of the forming the first openings and forming the second openings, at least part of two lines of the lower conductive lines are exposed in at least one opening, and at least one via connects the at least two lines of the lower conductive lines and one line of first or second upper conductive lines.

In the above fabrication operations, the first vias (and the first upper conductive lines) and the second vias (and the second upper conductive lines) are fabricated by separate patterning operations including lithography and dry etching). The proximity (a minimum space) between two features (e.g., vias or lines) is limited by a resolution limit R of the lithography process, and the pitch of plural patterns is generally set close to R.

Figure 2B:
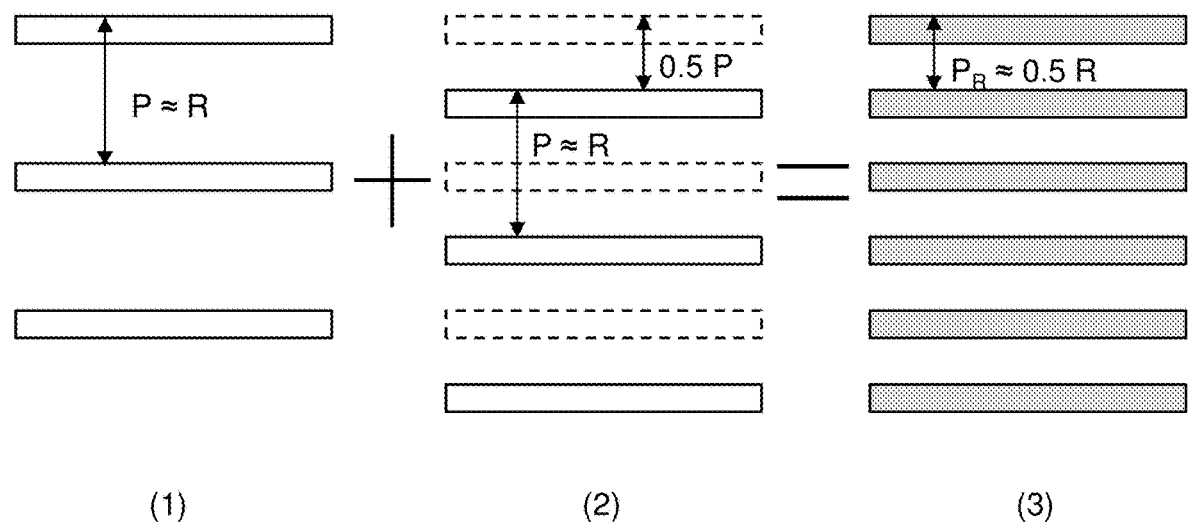
FIG. 2B shows an conceptual figure illustrating two separate patterning operations.
Figure 3A:
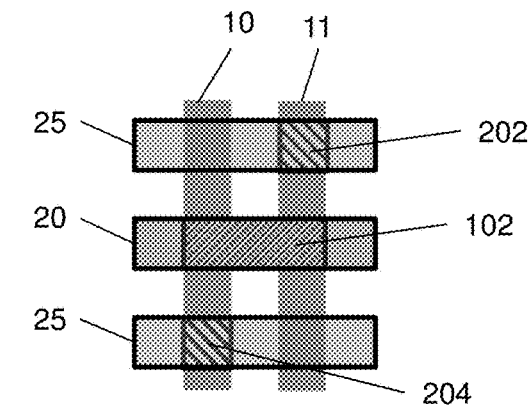
FIGS. 3A, 3B, 3C and 3D are exemplary layout structures according to various aspects of the present disclosure.
Figure 3B:
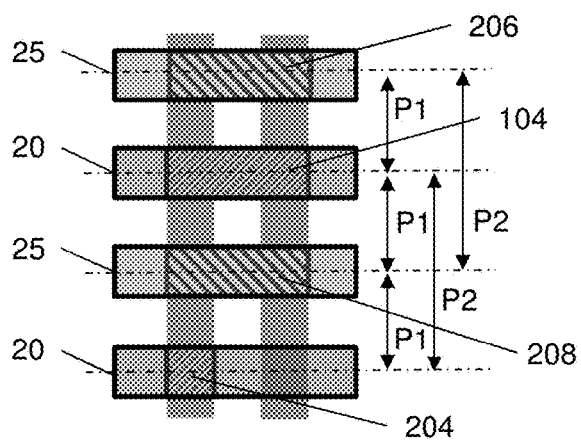
Figure 3C:
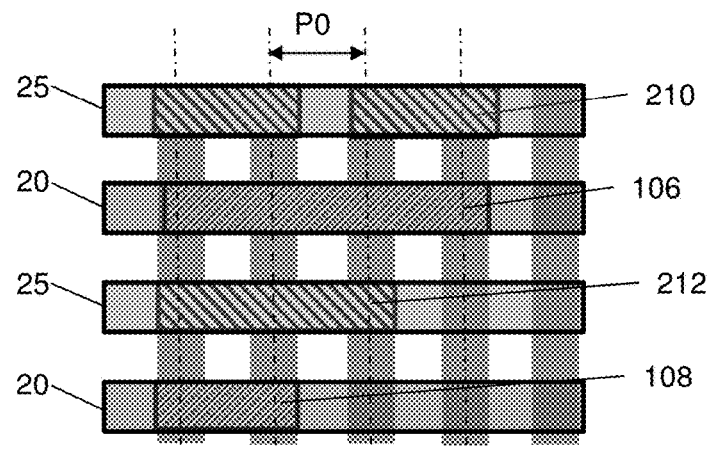
Figure 3D:
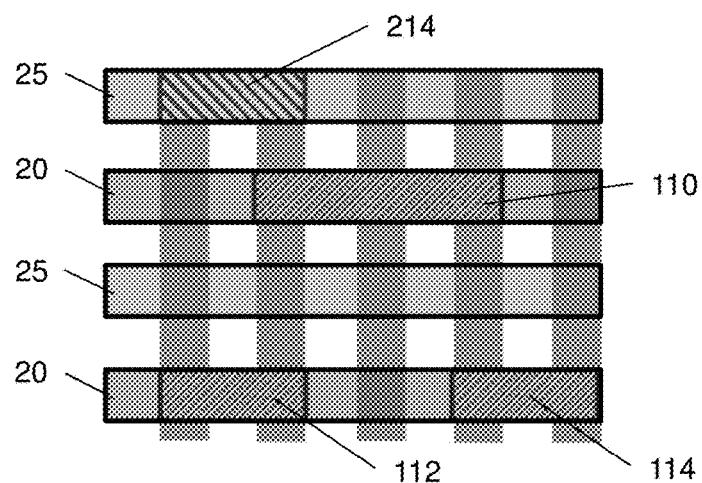

When only one lithography operation is used to fabricate plural patterns, the pitch P of the patterns is close to R and cannot be less than R (see, FIG. 2B(1)). In contrast, when two separate lithograph operations are used, and patterns are arranged shifted at 0.5P with each other (see, FIG. 2B(2)), the pitch P of the patterns in each lithograph operation can be set closer to R. Accordingly, the resultant patterns can have a pitch $P_R$ closer to 0.5 R (see, FIGS. 2B(3)). It is noted that because of alignment errors or some process variations, the resultant patterns may not have the exactly constant pitch $P_R$. In such a case, the variation (e.g., 3σ for 10 measurement points) of the pitch $P_R$ may be equal to or less than about 0.1 P, and if the variation of the pitch $P_R$ is equal to or less than about 0.1 P, the resultant patterns have a substantially equal pitch.

FIGS. 3A-3D are exemplary layout structures according to various aspects of the present disclosure. In these figures, the first vias 102, 104, 106, 108, 110, 112 and 114 are formed by separate patterning operations from the second vias 202, 204, 206, 208, 210, 212 and 214. As shown in these figures, at least one of the first and/or second vias connects three or more lines of the lower conductive lines 10 to one upper conductive line. Further, two or more vias of first vias or two or more vias of second vias can be arranged to one first upper conductive line or one second upper conductive line. In one embodiment, one of the first and/or second vias connects only one line of the lower conductive lines and only one line of the upper conductive lines. At least one of the upper (or lower) conductive lines is not connected to the lower (or upper) conductive lines through any via in come embodiments.

Figure 4:
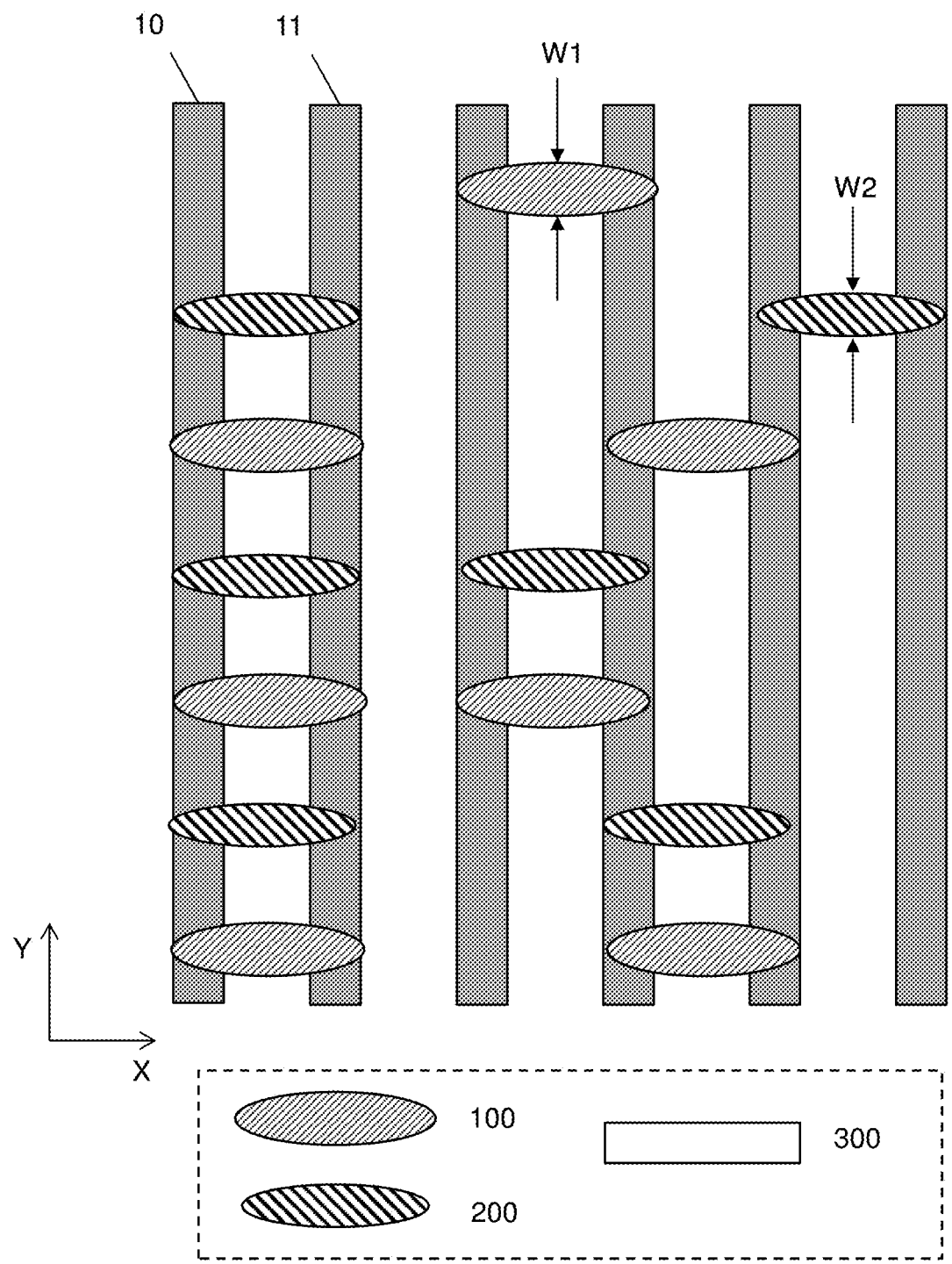
FIG. 4 shows an exemplary plan view of a semiconductor device according to one embodiment of the present disclosure.

FIG. 4 shows an exemplary plan view of a semiconductor device according to one embodiment of the present disclosure. In FIG. 4, the first and second vias shown are all vias connected to two lower conductive lines 10. Due to lithography and etching processes, the shape of the first and second vias becomes elongated or rounded rectangular or ellipsoid, even though the original design 300 is a rectangular. As set forth above, the first vias and the second vias are formed by separate patterning operations. Accordingly, due to process variations, even if the first vias and the second vias have the same design pattern 300, an average width of the first vias 100 is different from an average width of the second vias 200. The widths W1 and W2 are measured at the center of the vias, and the average width is calculated from more than 5 vias, which may be within a same field of view of a scanning electron microscope (SEM). When the difference between the average width of the first vias 100 and the average width of the second vias 200 is equal to or more than 0.1 W (W is the average width of all of the vias), it is determined that the average width of the first vias 100 is different from the average width of the second vias 200.

FIGS. 5-8 show exemplary cross-sectional views of a semiconductor device at various fabrication stages of according to one embodiment of the present disclosure. FIGS. 5-8 illustrate operations for fabricating a first via and a first upper conductive line (or a second via and a second upper conductive line) using a dual damascene process. In these figures, some layers/features are omitted for simplification. It is understood that additional operations can be provided before, during, and after processes shown by these figures, and some of the operations described below can be replaced or eliminated, for additional embodiments of the method. The order of the operations/processes may be interchangeable.

Figure 5:
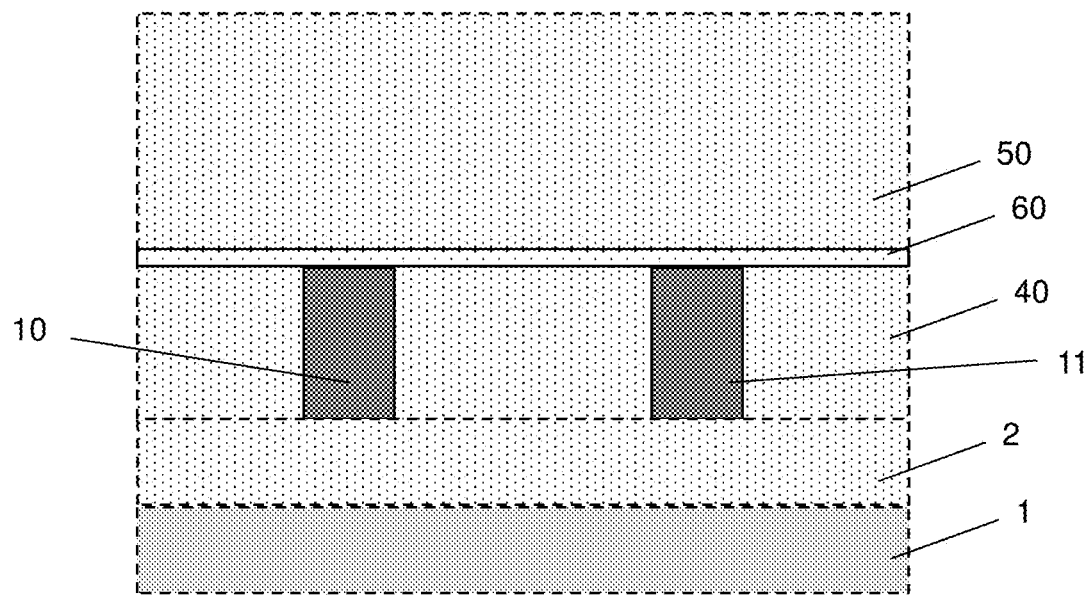
FIGS. 5, 6, 7 and 8 show exemplary cross-sectional views of a semiconductor device at various fabrication stages of according to one embodiment of the present disclosure.

As shown in FIG. 5, lower conductive lines 10, 11 are disposed over a semiconductor substrate 1. An insulating layer 2 may be disposed between the substrate 1 and the lower conductive lines 10, 11. The substrate 1 and the insulating layer 2 are omitted in FIGS. 6 and 7.

A second insulating layer 50 is formed over the first insulating layer 40 and the lower conductive lines 10, 11. As shown in FIG. 5, an etching stop layer 60 is interposed between the first and second insulating layers.

Figure 6:
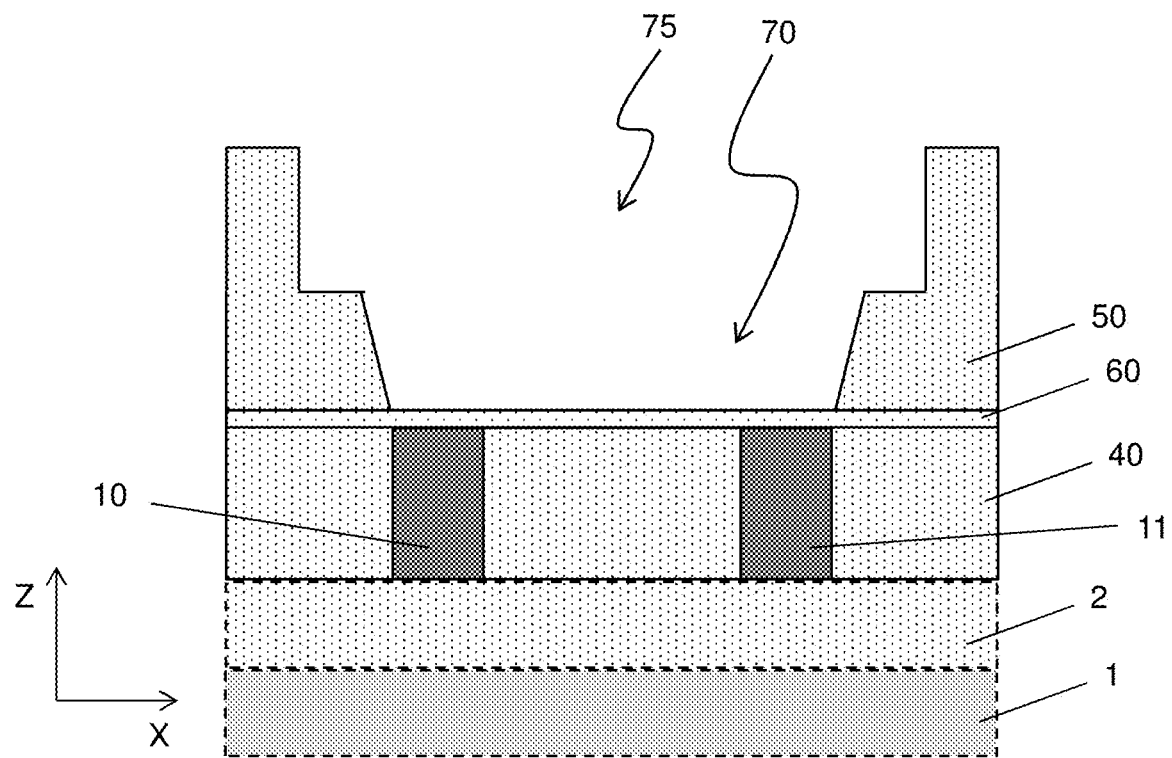

As shown in FIG. 6, an opening 70 for a via and an opening 75 for an upper conductive line is formed in the second insulating layer 50 by using, for example, lithography and dry etching operations. Here, the etching of the second insulating layer 50 substantially stops at the etching stop layer 60.

Figure 7:
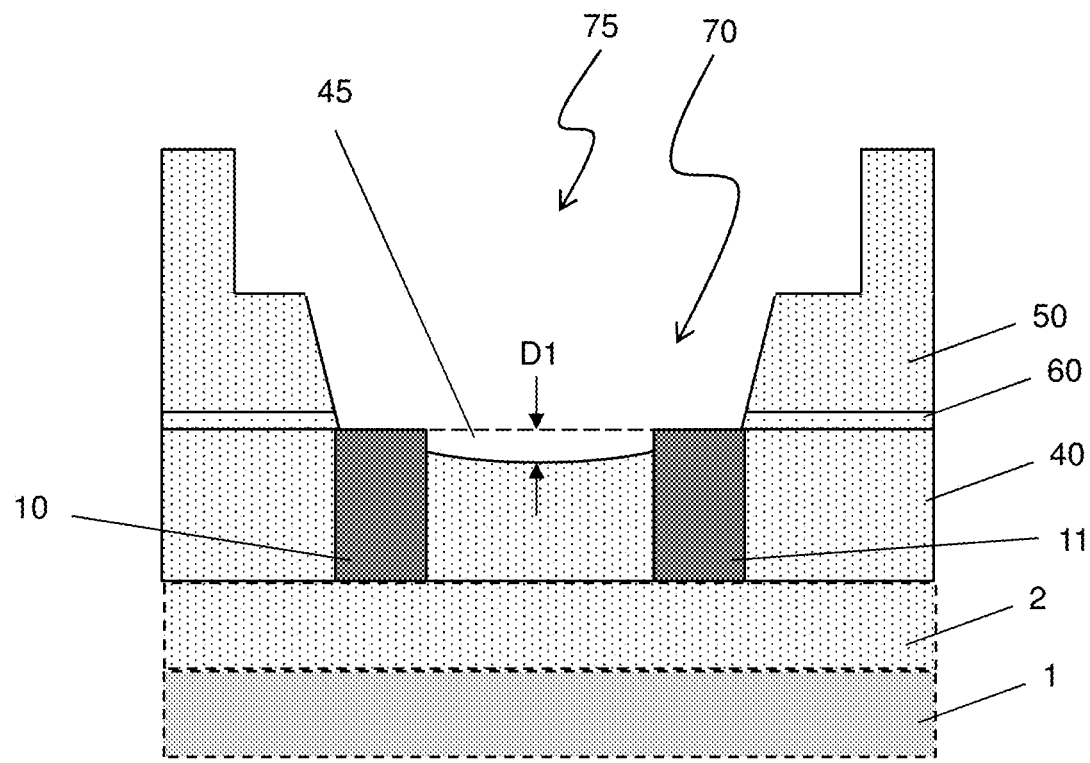

Then, as shown in FIG. 7, the etching stop layer 60 exposed in the bottom of the opening 70 is removed by dry and/or wet etching. Due to the etching operations and/or cleaning operations after the etching operation and/or before forming a metal material, the bottom of the opening 70 (i.e., the upper surface 45 of the first insulating layer 40) is slightly etched. The depth D1 measured at the lowest portion of the upper surface 45 from the level of the uppermost portion of the lower conductive lines 10, 11 shown in FIG. 7 is in a range from about 3 nm to about 30 nm.

Figure 8:
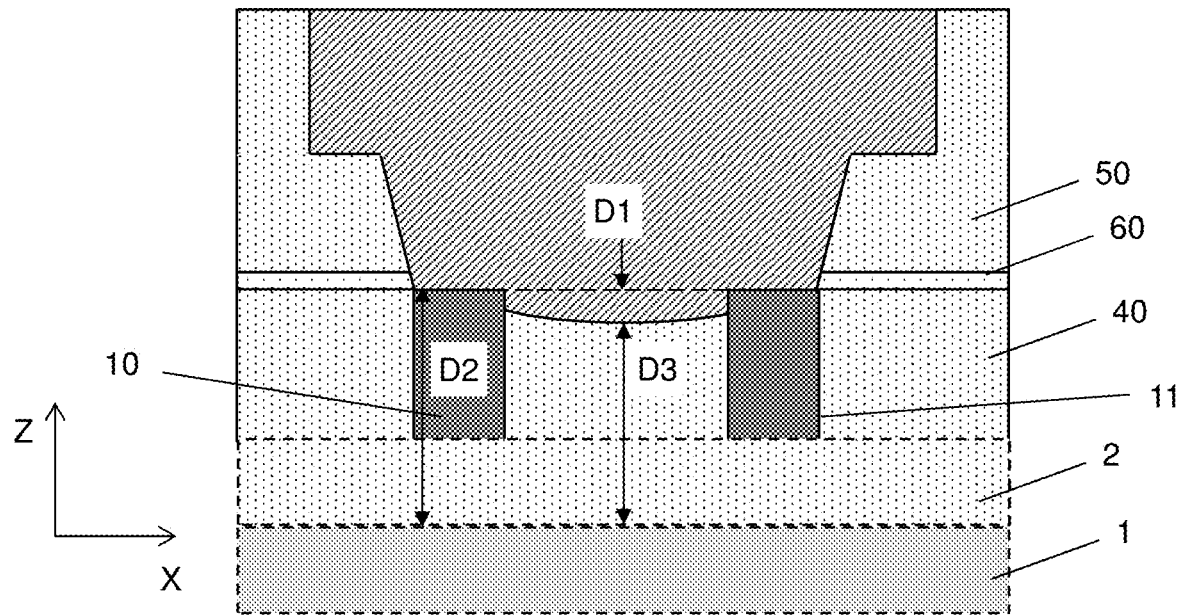

Next, as shown in FIG. 8, one or more layers of metal material is formed in the openings 70 and 75.

As shown in FIG. 8, the lowermost portion of the conductive material filled in the opening 70 (via) is closer to the semiconductor substrate 1 than the uppermost portion of the lower conductive lines 10. In other words, the distance D2 between the surface of the substrate 1 and the uppermost portion of the lower conductive lines 10 is larger than the distance D3 between the surface of the substrate 1 and the lowermost portion of the via. As shown in FIG. 8, the lowermost portion of the via is located between the two adjacent lower conductive lines connected to the via. Further, the etching stop layer 60 does not exist under the via between the two adjacent lower conductive lines connected to the via. The uppermost portion of the lower conductive lines 10 is located at the portion covered by the etching stop layer 60 or the second insulating layer 50.

In the above embodiments, two separate patterning operations are employed for the first vias/upper conductive lines and the second vias/upper conductive lines. However, it is possible to employ three or more separate patterning operations for three or more groups of vias and upper conductive lines.

The various embodiments or examples described herein offer several advantages over the existing art. For example, in the present disclosure, since one via connects two or more lower conductive lines and one upper conductive line, a contact resistance can be reduced, and a higher design flexibility can be achieved. Further, by using multiple patterning operations, higher density wiring/via structures can be achieved.

It will be understood that not all advantages have been necessarily discussed herein, no particular advantage is required for all embodiments or examples, and other embodiments or examples may offer different advantages.

According to one aspect of the present disclosure, a method for manufacturing a semiconductor device includes the following operations. A plurality of lower conductive lines extending in a first direction are formed over a semiconductor substrate. An insulating layer overlying the plurality of lower conductive lines is formed. A plurality of first vias are formed by forming first openings in the insulating layer and filling the first openings with a conductive material. A plurality of second vias are formed by forming second openings in the insulating layer and filling the second openings with a conductive material. A plurality of first upper conductive lines are formed. The plurality of first upper conductive lines extend in a second direction crossing the first direction and are connected to the plurality of first vias. A plurality of second upper conductive lines are formed. The plurality of second upper conductive lines extend in the second direction and are connected to the plurality of second vias. The forming the plurality of first vias and forming the plurality of second vias are performed by separate pattering operations. In at least one of the forming the first openings and forming the second openings, at least a part of two lines of the plurality of lower conductive lines are exposed in at least one opening, so that at least one via connects the at least two lines of the plurality of lower conductive lines and one line of the plurality of first or second upper conductive lines. The plurality of first upper conductive lines and the plurality of second upper conductive lines are alternately arranged with a first pitch in the first direction. The plurality of first vias are disposed with a second pitch in the first direction, the second pitch being twice the first pitch.

According to another aspect of the present disclosure, a semiconductor device includes a plurality of lower conductive lines overlying a semiconductor substrate and extending in a first direction, an insulating layer overlying the plurality of lower conductive lines, a plurality of upper conductive lines overlying the insulating layer and the first conductive lines and extending in a second direction crossing the first direction, and a plurality of vias filled with a conductive material formed in the insulating layer. The plurality of upper conductive lines are arranged in the first direction with a first pitch. The plurality of vias includes first vias and second vias. At least one via of the first vias connects at least two lines of the plurality of lower conductive lines and one line of the plurality of upper conductive lines. An average width in the first direction of the first vias is different from an average width in the first direction of the second vias.

According to another aspect of the present disclosure, a semiconductor device includes a plurality of lower conductive lines overlying a semiconductor substrate and extending in a first direction, the plurality of lower conductive lines including a first lower conductive line and a second lower conductive line adjacent to the first lower conductive line in a second direction crossing the first direction, a first insulating layer overlying the plurality of lower conductive lines, a plurality of upper conductive lines overlying the first insulating layer and the first conductive lines and extending in the second direction, the plurality of upper conductive lines including a first upper conductive line, and a plurality of vias filled with a conductive material formed in the insulating layer, the plurality of vias including a first via. The first via connects the first and second lower conductive line and the first upper conductive line. A lowermost portion of the conductive material filled in the first via is closer to the semiconductor substrate than an uppermost portion of the first and second lower conductive lines.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
   forming a plurality of lower conductive lines extending in a first direction over a semiconductor substrate;
   forming an insulating layer overlying the plurality of lower conductive lines;
   forming a plurality of first vias by forming first openings in the insulating layer and filling the first openings with a conductive material;
   forming a plurality of second vias by forming second openings in the insulating layer and filling the second openings with a conductive material;
   forming a plurality of first upper conductive lines extending in a second direction crossing the first direction and connected to the plurality of first vias; and
   forming a plurality of second upper conductive lines extending in the second direction and connected to the plurality of second vias, wherein:
   the forming the plurality of first vias and forming the plurality of second vias are performed by separate patterning operations,
   in at least one of the forming the first openings and forming the second openings, at least a part of two lines of the plurality of lower conductive lines are exposed in at least one opening, so that at least one via connects the at least two lines of the plurality of lower conductive lines and one line of the plurality of first or second upper conductive lines,
   the plurality of first upper conductive lines and the plurality of second upper conductive lines are alternately arranged with a first pitch in the first direction, and
   the plurality of first vias are disposed with a second pitch in the first direction, the second pitch being twice the first pitch.

2. The method according to claim 1, wherein the plurality of second vias are disposed with the second pitch in the first direction.

3. The method according to claim 2, wherein:
   the plurality of first upper conductive lines are arranged with the second pitch in the first direction, and
   the plurality of second upper conductive lines are arranged with the second pitch in the first direction.

4. The method according to claim 1, wherein:
   the plurality of first vias and the plurality of first upper conductive lines are formed by a first dual damascene process, and
   the plurality of second vias and the plurality of second upper conductive lines are formed by a second dual damascene process.

5. The method according to claim 1, wherein:
   the plurality of first vias and the plurality of second vias have the same design pattern, and
   an average width in the first direction of the plurality of first vias is different from an average width in the first direction of the plurality of second vias.

6. The method according to claim 1, wherein:
   in the forming the first openings, at least a part of two lines of the plurality of lower conductive lines are exposed in at least one of the first openings, so that at least one of the plurality of first vias connects the at least two lines of the plurality of lower conductive lines, and
   in forming the second openings, at least a part of two lines of the plurality of lower conductive lines are exposed in at least one of the second openings, so that at least one of the plurality of second vias connects the at least two lines of the plurality of lower conductive lines.

7. The method according to claim 6, wherein at least one via of the plurality of first vias or the plurality of second vias connects only one line of the lower conductive line and only one line of the plurality of first or second upper conductive lines.

8. A method for manufacturing a semiconductor device comprising:
   forming a plurality of lower conductive lines extending in a first direction over a semiconductor substrate;
   forming an insulating layer overlying the plurality of lower conductive lines;
   forming vias, each filled with a conductive material formed in the insulating layer; and
   forming a plurality of upper conductive lines overlying the insulating layer and the first conductive lines and extending in a second direction crossing the first direction, wherein:
   the at least two of the plurality of upper conductive lines overlap at least two of the plurality of lower conductive lines in plan view, and
   at least one of the vias connects at least two lines of the plurality of lower conductive lines and one line of the plurality of upper conductive lines.

9. The method according to claim 8, wherein a lowermost portion of the conductive material filled in the at least one of the vias is closer to the semiconductor substrate than an uppermost portion of the at least two lines of the plurality of lower conductive lines.

10. The method according to claim 8, wherein:
the vias comprises first vias and second vias,
the plurality of upper conductive lines are arranged with a first pitch in the first direction, and
the first vias are disposed with a second pitch in the first direction, the second pitch being twice the first pitch.

11. The method according to claim 10, wherein the plurality of second vias are disposed with the second pitch in the first direction.

12. The method according to claim 8, wherein at least one of the vias connects only one line of the plurality of lower conductive lines and only one line of the plurality of upper conductive lines.

13. The method according to claim 8, wherein at least one of the vias connects at least three lines of the plurality of lower conductive lines and only one line of the plurality of upper conductive lines.

14. The method according to claim 8, wherein:
the plurality of lower conductive lines includes a first line connected to a gate of a transistor and a second line connected to a source or a drain of the transistor, and
the first line and the second line are connected to one of the plurality of upper conductive lines via the at least one via.

15. The method according to claim 14, wherein the one of the plurality of upper conductive line connected to the first line and the second line is electrically connected to a power supply line.

16. A method for manufacturing a semiconductor device comprising:

forming a plurality of lower conductive lines extending in a first direction over a semiconductor substrate, the plurality of lower conductive lines being embedded in a first dielectric layer;
forming a second dielectric layer over the plurality of lower conductive lines and the first dielectric layer;
forming a third dielectric layer over the second dielectric layer; and
forming a plurality of first vias and a plurality of second vias in at least the third dielectric layer, wherein:
the plurality of first vias are formed by a first patterning operation including a first lithography operation and the plurality of second vias are formed by a second patterning operation including a second lithography operation, and
at least one of the plurality of first vias connects two lower conductive lines of the plurality of lower conductive lines.

17. The method of claim 16, further comprising
forming a plurality of upper conductive lines extending in a second direction crossing the first direction, wherein:
the plurality of upper conductive lines arranged with a first pitch in the first direction, and
the plurality of first vias are disposed with a second pitch in the first direction, the second pitch being twice the first pitch.

18. The method of claim 16, wherein the first patterning operation includes a first etching operation, and the second patterning operation includes a second etching operation.

19. The method of claim 16, wherein at least one of the plurality of second vias connects two lower conductive lines of the plurality of lower conductive lines.

20. The method of claim 19, wherein the two lower conductive lines connected to the at least one of the second vias are connected to at least one of the plurality of first vias.

* * * * *